US009509332B1

(12) United States Patent
Garrity et al.

(10) Patent No.: US 9,509,332 B1
(45) Date of Patent: Nov. 29, 2016

(54) DUAL SIGMA-DELTA ANALOG-TO-DIGITAL CONVERTER

(71) Applicant: FREESCALE SEMICONDUCTOR, INC., Austin, TX (US)

(72) Inventors: Douglas A. Garrity, Gilbert, AZ (US); Mariam Hoseini, Tempe, AZ (US); Mark J. Stachew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/934,442

(22) Filed: Nov. 6, 2015

(51) Int. Cl.
*H03M 3/00* (2006.01)
(52) U.S. Cl.
CPC .................... *H03M 3/468* (2013.01)
(58) Field of Classification Search
CPC ...................................... H03M 3/468
USPC ................................. 341/143, 144, 155, 122
See application file for complete search history.

(56) References Cited

U.S. PATENT DOCUMENTS

| 5,030,954 | A | * | 7/1991 | Ribner | H03M 3/47 341/143 |
|---|---|---|---|---|---|
| 5,936,562 | A | | 8/1999 | Brooks et al. | |
| 6,535,157 | B1 | | 3/2003 | Garrity et al. | |
| 7,449,923 | B2 | | 11/2008 | Braswell et al. | |
| 8,217,815 | B2 | * | 7/2012 | Chen | H03M 3/474 341/118 |
| 8,339,302 | B2 | | 12/2012 | Kabir | |
| 8,902,093 | B1 | * | 12/2014 | Leuciuc | H03M 1/1245 341/118 |
| 2009/0128384 | A1 | * | 5/2009 | Di Giandomenico | H03M 3/398 341/143 |
| 2014/0340249 | A1 | | 11/2014 | Bernardinis | |

OTHER PUBLICATIONS

Boser, B. et al., "The Design of Sigma-Delta Modulation Analog-to-Digital Converters," IEEE Journal of Solid-State Circuits,vol. 23, No. 6, Dec. 1988, pp. 1298-1308.
Baker, Bonnie, "How Delta-Sigma ADCs Work, Part I," High-Performance Analog Products; Texas Instruments Incorporated, Analog Applications Journal, 3Q 2011; printed from <<http://www.ti.com/lit/an/slyt423/slyt423.pdf>> on Nov. 6, 2015; 6 pages.

* cited by examiner

*Primary Examiner* — Peguy Jean Pierre

(57) ABSTRACT

A sigma-delta ($\Sigma\Delta$) analog-to-digital converter (ADC) comprises a main $\Sigma\Delta$ modulator configured to receive an analog input signal at a main $\Sigma\Delta$ modulator input and to provide a main digital output signal representative of the analog input signal and an auxiliary $\Sigma\Delta$ modulator configured to receive an auxiliary input signal at an auxiliary $\Sigma\Delta$ modulator input and to provide an auxiliary digital output signal, wherein the $\Sigma\Delta$ ADC comprises a shared integrator stage, the shared integrator stage is configured to be used by the main $\Sigma\Delta$ modulator and the auxiliary $\Sigma\Delta$ modulator, wherein, alternatingly, the shared integrator stage is selectively communicatively coupled to receive the analog input signal when configured to be used by the main $\Sigma\Delta$ modulator and selectively communicatively coupled to receive the auxiliary input signal when configured to be used by the auxiliary $\Sigma\Delta$ modulator.

19 Claims, 9 Drawing Sheets

US 9,509,332 B1

DUAL SIGMA-DELTA ANALOG-TO-DIGITAL CONVERTER

BACKGROUND

Field of the Disclosure

The present application relates generally to data conversion circuits and more particularly to a sigma-delta ($\Sigma\Delta$) analog-to-digital converter (ADC).

Background of the Disclosure

ADCs are used to convert an analog signal to one or more digital values representative of the analog signal. It can be desirable to have a way to verify proper operation of a sigma-delta ADC. For example, an ability to check or monitor a system including a sigma-delta ADC for faults such as opens, shorts, and other system faults can be beneficial. This can be especially desirable for critical applications, for example, automotive applications, such as powertrain applications.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A dual sigma-delta ($\Sigma\Delta$) analog-to-digital converter (ADC) provides a main $\Sigma\Delta$ ADC and an auxiliary $\Sigma\Delta$ ADC. The auxiliary $\Sigma\Delta$ ADC can share at least one integrator stage with the main $\Sigma\Delta$ ADC. One integrator stage can be shared to provide a first-order $\Sigma\Delta$ modulator for the auxiliary $\Sigma\Delta$ ADC, or more integrator stages can be shared to provide a higher-order $\Sigma\Delta$ modulator for the auxiliary $\Sigma\Delta$ ADC. For example, two integrator stages can be shared to provide a second-order $\Sigma\Delta$ modulator for the auxiliary $\Sigma\Delta$ ADC. As another example, more than two integrator stages can be shared to provide a correspondingly higher-order $\Sigma\Delta$ modulator for the auxiliary $\Sigma\Delta$ ADC. The use of an integrator stage by the main $\Sigma\Delta$ ADC or the auxiliary $\Sigma\Delta$ ADC is switchably selectable. The auxiliary $\Sigma\Delta$ ADC can be used to monitor the operation of the main $\Sigma\Delta$ ADC, for example, by checking whether any electrical faults, such as opens or shorts, exist at an input of the main $\Sigma\Delta$ ADC or by verifying the operation of the main $\Sigma\Delta$ ADC itself, or the auxiliary $\Sigma\Delta$ ADC can be used as an additional $\Sigma\Delta$ ADC for purpose in addition to the purpose served by the main $\Sigma\Delta$ ADC.

Figure 1:
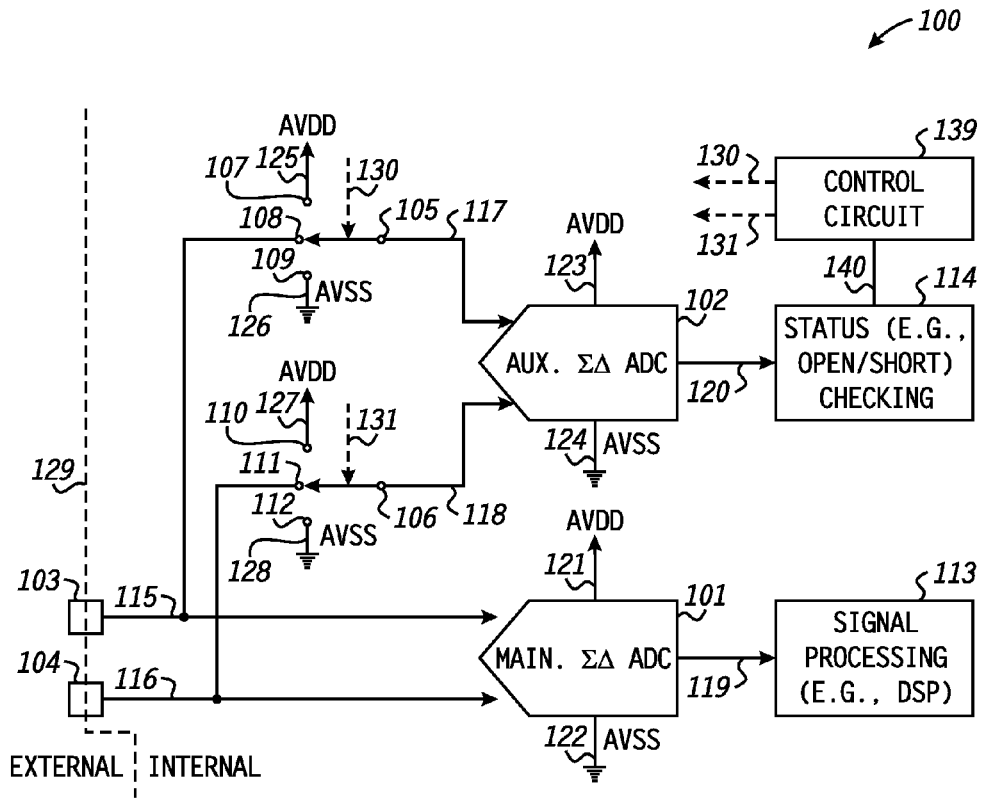
FIG. 1 is a block diagram illustrating a dual sigma-delta analog-to-digital converter in accordance with at least one embodiment.

FIG. 1 is a block diagram illustrating a dual sigma-delta ($\Sigma\Delta$) analog-to-digital converter (ADC) in accordance with at least one embodiment. Dual $\Sigma\Delta$ ADC 100 comprises main $\Sigma\Delta$ ADC 101, auxiliary $\Sigma\Delta$ ADC 102, signal processing block 113, status checking block 114, first auxiliary input switch 105, and second auxiliary input switch 106. A dashed line represents a boundary 129 between an external environment and an internal environment, for example, between an off-chip environment and an on-chip environment at an external interconnect, such as a pin, of an integrated circuit. Input pads 103 and 104, which may, for example, be differential input pads, at boundary 129 receive an analog input signal, such as a differential analog input signal from an external source, such as a sensor responsive to a physical parameter. Input pads 103 and 104 are connected, respectively, to nodes 115 and 116. Node 115 is connected to a first main $\Sigma\Delta$ ADC input of main $\Sigma\Delta$ ADC 101 and to switch terminal 108 of first auxiliary input switch 105. Node 116 is connected to a second main $\Sigma\Delta$ ADC input of main $\Sigma\Delta$ ADC 101 and to switch terminal 111 of second auxiliary input switch 106. First auxiliary input switch 105 and second auxiliary input switch 106 switchably and selectively communicatively couple the analog input signal, a positive supply voltage, a negative supply voltage, and a reference voltage to the input of auxiliary $\Sigma\Delta$ ADC 102.

Switch terminal 107 of first auxiliary input switch 105 and switch terminal 110 of second auxiliary input switch 106 are connected to a first supply voltage, for example, a positive supply voltage, such as an AVDD positive supply voltage. Switch terminal 109 of first auxiliary input switch 105 and switch terminal 112 of second auxiliary input switch 106 are connected to a second supply voltage, for example, a negative supply voltage, such as an AVSS negative supply voltage. The common switch terminal of first auxiliary input switch 105 is connected to a first auxiliary $\Sigma\Delta$ ADC input of auxiliary $\Sigma\Delta$ ADC 102. The common switch terminal of second auxiliary input switch 106 is connected to a second auxiliary $\Sigma\Delta$ ADC input of auxiliary $\Sigma\Delta$ ADC 102. The switch terminal to which the common switch terminal of first auxiliary input switch 105 is connected can be selected by a first auxiliary input switch selection signal at first auxiliary input switch selection input 130. The switch terminal to which the common switch terminal of second auxiliary input switch 106 is connected can be selected by a second auxiliary input switch selection signal at second auxiliary input switch selection input 131. A control circuit 139 can provide the first auxiliary input switch selection signal to first auxiliary input switch selection input 130 and the second auxiliary input switch selection signal to second input switch selection input 131. Control circuit 139 is connected to status checking block 114. Control circuit 139 can communicate with status checking block 114 to coordinate status checking operations, for example, by coordinating positions of first auxiliary input switch 105 and second auxiliary input switch 106. While first auxiliary input switch 105 and second auxiliary input switch 106 are shown with a particular number of poles connected to particular signals and voltages, embodiments may be practiced with other numbers of poles and other signals and voltages, as will be discussed in more detail below with respect to FIG. 3.

The AVDD positive supply voltage is connected to a positive supply terminal of main ΣΔ ADC 101 and to a positive supply terminal of auxiliary ΣΔ ADC 102. The AVSS negative supply voltage is connected to a negative supply terminal of main ΣΔ ADC 101 and to a negative supply terminal of auxiliary ΣΔ ADC 102. A main digital output of main ΣΔ ADC 101 is connected to an input of signal processing block 113. Signal processing block 113 may, for example, be a digital signal processing block. Signal processing block 113 may comprise, for example, a circuit to process the main output signal from the output of main ΣΔ ADC 101. An auxiliary digital output of auxiliary ΣΔ ADC 102 is connected to an input of status checking block 114. Status checking block 114 may, for example, comprise a circuit to provide checking for open ADC inputs, shorted ADC inputs, other electrical faults affecting the ADCs, and a functional status of main ΣΔ ADC 101.

Figure 2:
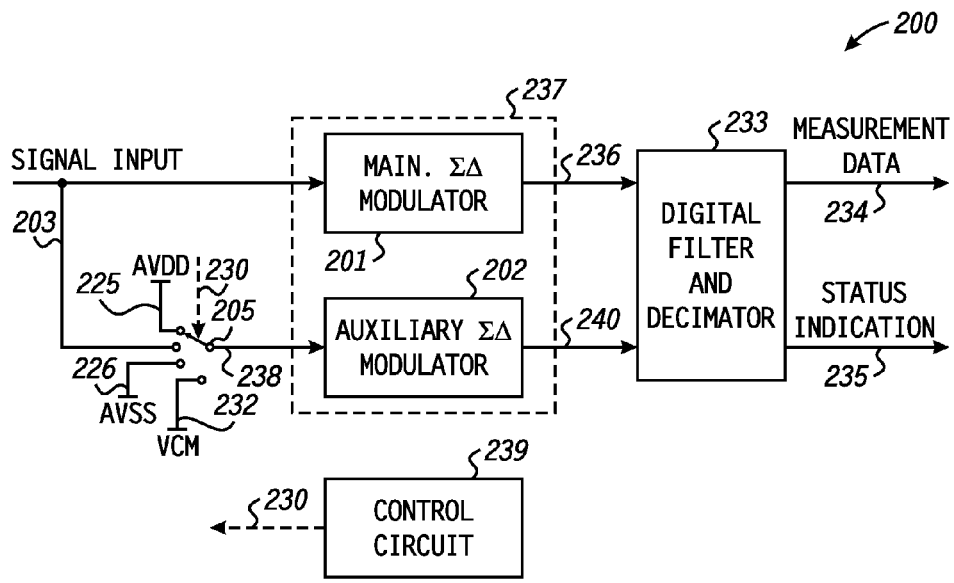
FIG. 2 is a block diagram illustrating a dual sigma-delta analog-to-digital converter with shared components in accordance with at least one embodiment.

FIG. 2 is a block diagram illustrating a dual sigma-delta (ΣΔ) analog-to-digital converter (ADC) with shared components in accordance with at least one embodiment. Dual ΣΔ ADC 200 comprises main ΣΔ modulator 201, auxiliary ΣΔ modulator 202, and digital filter and decimator block 232. An analog input signal is received at signal input 203. Signal input 203 is connected to a main analog signal input of main ΣΔ modulator 201 and to a switch terminal of auxiliary input switch 205. A first supply voltage 225, for example, a positive supply voltage, such as an AVDD positive supply voltage, is connected to a switch terminal of auxiliary input switch 205. A second supply voltage 226, for example, a negative supply voltage, such as an AVSS negative supply voltage, is connected to a switch terminal of auxiliary input switch 205. A reference voltage 232, for example, a VCM common mode voltage, is connected to a switch terminal of auxiliary input switch 205. A common switch terminal of auxiliary input switch 205 is connected to an auxiliary input 238 of auxiliary ΣΔ modulator 202. Auxiliary input switch 205 can be switched to connect the common switch terminal to one of the other switch terminals under the control of and in response to an auxiliary input switch selection signal at auxiliary input switch selection input 230. Control circuit 239 can provide the auxiliary input switch selection signal to auxiliary input switch selection input 230. Thus, auxiliary input 238 of auxiliary ΣΔ modulator 202 can be configured to receive as its auxiliary input signal any of first supply voltage 225, second supply voltage 226, reference voltage 232, and the analog input signal of signal input 203.

Main ΣΔ modulator 201 and auxiliary ΣΔ modulator 202 can share components, as indicated by common hardware block 237. As an example, one or more integrator stages can be shared between main ΣΔ modulator 201 and auxiliary ΣΔ modulator 202. Main ΣΔ modulator 201 provides a main ΣΔ modulator output 236 to digital filter and decimator block 233. Auxiliary ΣΔ modulator 202 provides an auxiliary ΣΔ modulator output 240 to digital filter and decimator block 233. Digital filter and decimator 233 provides measurement data at measurement data output 234 and a status indication at status indication output 235. While signal input 203, main ΣΔ modulator output 236, and auxiliary ΣΔ modulator output 240 are shown as single nodes, representing single-ended signals, signal input 203, main ΣΔ modulator output 236, auxiliary ΣΔ modulator output 240, or combinations thereof can be implemented in other forms, such as differential signal paths comprising two nodes for each path. In a differential signaling embodiment, switch 205 can comprise two poles, as shown by switches 105 and 106 of FIG. 1, with one pole for each of the two nodes.

Figure 3:
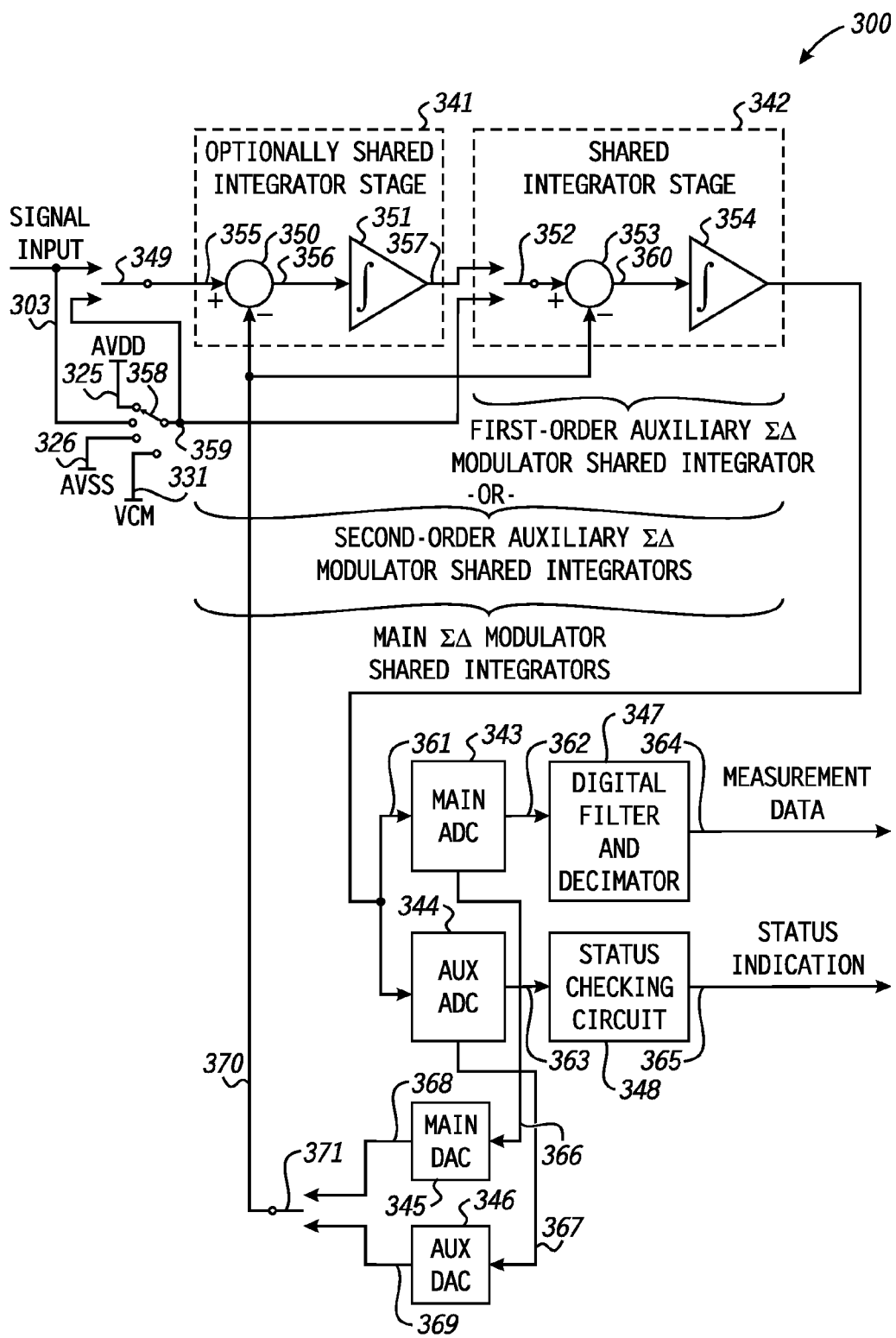
FIG. 3 is a block diagram illustrating a dual sigma-delta analog-to-digital converter with at least one shared integrator stage in accordance with at least one embodiment.

FIG. 3 is a block diagram illustrating a dual sigma-delta analog-to-digital converter with at least one shared integrator stage in accordance with at least one embodiment. Dual ΣΔ ADC 300 comprises first difference block 350, first integrator 351, second difference block 353, second integrator 354, main ADC 343, auxiliary ADC 344, main digital-to-analog converter (DAC) 345, auxiliary digital-to-analog converter (DAC) 346, digital filter and decimator 347, and status checking circuit 348. A main ΣΔ modulator is a second-order main ΣΔ modulator and comprises both optionally shared integrator stage 341 and shared integrator stage 342. In accordance with one embodiment, shared integrator stage 342 comprising second difference block 353 and second integrator 354 is shared between a main ΣΔ modulator and an auxiliary ΣΔ modulator. In such an embodiment, the auxiliary ΣΔ modulator is a first-order auxiliary ΣΔ modulator. In accordance with another embodiment, optionally shared integrator stage 341 comprising first difference block 350 and first integrator 351 is also shared between the main ΣΔ modulator and the auxiliary ΣΔ modulator. In such an embodiment, the auxiliary ΣΔ modulator is a second-order auxiliary ΣΔ modulator.

An input signal at signal input 303 is connected to a first switch terminal of first input switch 349 and to a switch terminal of auxiliary input switch 358. First supply voltage 325, labelled AVDD, is connected to a switch terminal of auxiliary input switch 358. Second supply voltage 326, labelled AVSS, is connected to a switch terminal of auxiliary input switch 358. Reference voltage 331, labelled VCM, is connected to a switch terminal of auxiliary input switch 358. Optionally, other inputs, such as another signal input independent of signal input 303, for example, an analog input from an on-chip temperature sensor or other sensor, can be provided to one or more other switch terminals of auxiliary input switch 358. A common switch terminal 359 of auxiliary input switch 358 is connected to a second switch terminal of first input switch 349 and to a second terminal of second input switch 352. A common switch terminal of first input switch 349 is connected to a positive input 355 of second difference block 350. An output 356 of second difference block 350 is connected to an input of first integrator 351. An output 357 of first integrator 351 is connected to a first switch terminal of second input switch 352. A common switch terminal of second input switch is connected to a positive input of second difference block 353. An output of second difference block 353 is connected to an input of second integrator 354. An output of second integrator 354 at node 361 is connected to inputs of main ADC 343 and auxiliary ADC 344.

Main ADC 343 is connected to and provides an output to main digital-to-analog converter (DAC) 345 and auxiliary ADC 344 is connected to and provides an output to auxiliary DAC 346. Main DAC 345 provides an output to a first terminal 368 of switch 371. Auxiliary DAC 346 provides an output to a second terminal 369 of switch 371. A common switch terminal 370 of switch 371 is connected to a negative input of first difference block 350 and to a negative input of second difference block 353. Main ADC 343 is connected to and provides an output 362 to digital filter and decimator 347. Digital filter and decimator 347 provides a measurement data output 364. Auxiliary ADC 344 is connected to and provides an output 363 to status checking circuit 348. Status checking circuit 348 provides a status indication output 365. Main ADC 343 and auxiliary ADC 344 may be implemented as ADCs providing, as an example, one-bit resolution or, as another example, more-than-one-bit resolution, in the samples they provide. Main ADC 343 and auxiliary ADC 344 can be n-bit quantizing block, where n is a number greater than zero.

While shared integrator stage 342 is shown as the second integrator stage, following a first integrator stage shown as optionally shared integrator stage 341, other embodiments are possible, such using the first integrator stage as the shared integrator stage and the second stage as the optionally shared integrator stage, in which case a switchably selectable communicative coupling from 357 to 361 can be provided to share the first integrator stage and bypass the second integrator stage when a first-order auxiliary ΣΔ integrator is desired. As examples, given a main ΣΔ integrator comprising a number of integrator stages, an auxiliary ΣΔ integrator may be switchably configured to use any one of the integrator stages to provide a first-order auxiliary ΣΔ integrator, any two of the integrator stages to provide a second-order auxiliary ΣΔ integrator, or any n of the integrator stages to provide an nth-order auxiliary ΣΔ integrator, wherein n is less than or equal to the number of integrator stages in the main ΣΔ integrator. Thus, while embodiments are shown with two integrator stages, embodiments may be practice with any number of integrator stages, of which any number may be shared between a main ΣΔ modulator and an auxiliary ΣΔ modulator to provide the main ΣΔ modulator with any number of stages and the auxiliary ΣΔ with any number of stages. As an example, ΣΔ of higher than second order can be implemented. While signal input 303 is shown as a single node, representing a single-ended signal input, and other nodes following the integrator stages are also shown as single nodes, signal paths shown as single-ended signal paths can be implemented in other forms, for example, as differential signal paths having two nodes, wherein the signal is represented by a difference of the voltages of the two nodes.

Figure 4:
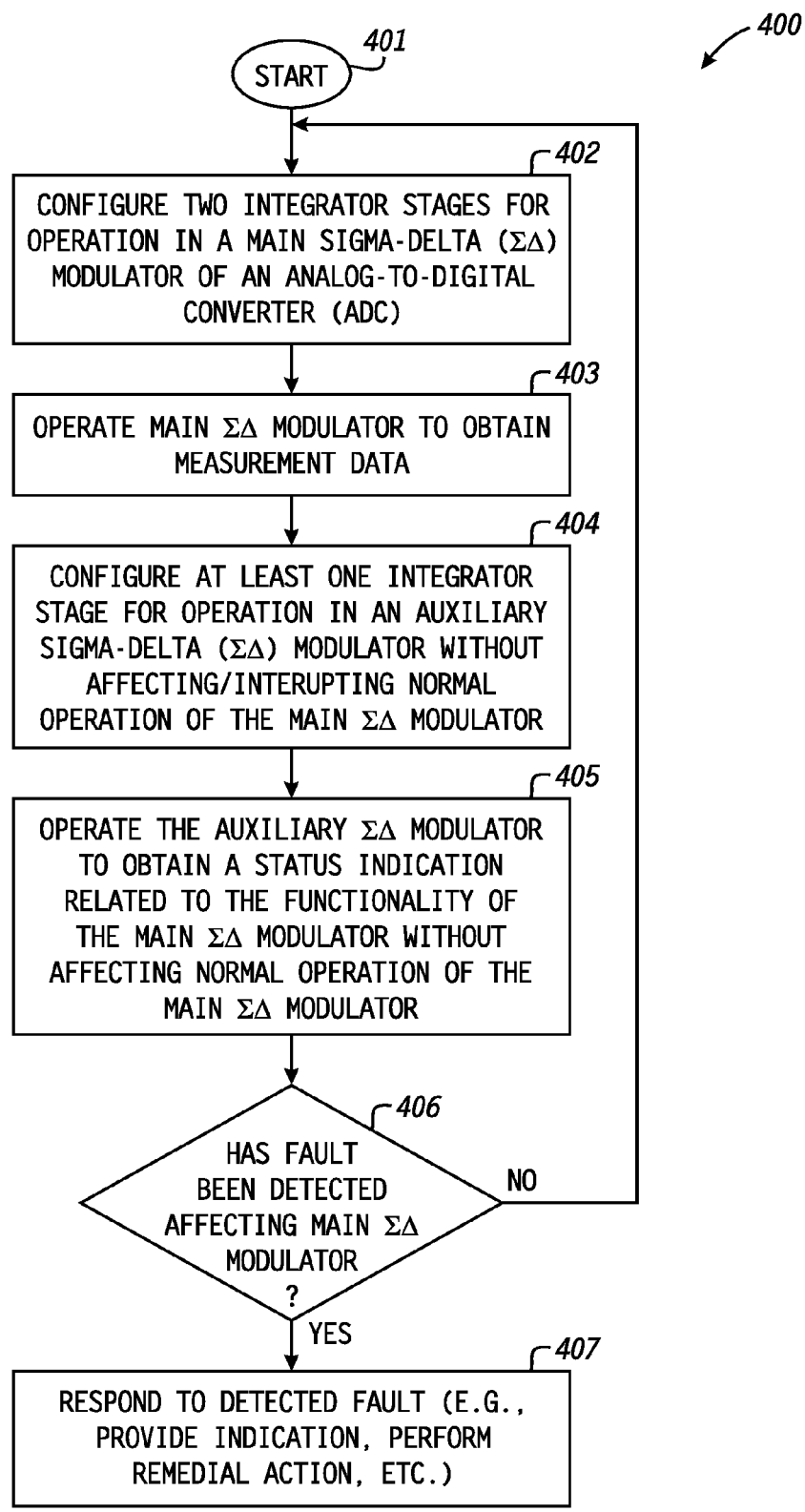
FIG. 4 is a flow diagram illustrating a method for operating a sigma-delta analog-to-digital converter and verifying its functionality in accordance with at least one embodiment.

FIG. 4 is a flow diagram illustrating a method for operating a sigma-delta analog-to-digital converter and verifying its functionality in accordance with at least one embodiment. Method 400 begins at block 401. From block 401, method 400 continues to block 402. In block 402, two integrator stages are configured for operation in a main sigma-delta (ΣΔ) modulator of a main ΣΔ analog-to-digital converter (ADC). From block 402, method 400 continues to block 403. In block 403, the main ΣΔ ADC operates to obtain measurement data. From block 403, method 400 continues to block 404. In block 404, at least one integrator stage is configured for operation in an auxiliary ΣΔ modulator of an auxiliary ΣΔ ADC. Even with the auxiliary ΣΔ modulator configured to share at least one integrator stage with the main ΣΔ modulator, the auxiliary ΣΔ modulator can operate without affecting or interrupting normal operation of the main ΣΔ modulator. From block 404, method 400 continues to block 405. In block 405, the auxiliary ΣΔ ADC operates to check the functionality of the main ΣΔ ADC. For example, the auxiliary ΣΔ modulator operates to obtain a status indication related to the functionality of the main ΣΔ modulator. Even with the auxiliary ΣΔ modulator configured to share at least one integrator stage with the main ΣΔ modulator, the auxiliary ΣΔ modulator can obtain the status indication related to the functionality of the main ΣΔ modulator without affecting normal operation of the main ΣΔ modulator. From block 405, method 400 continues to decision block 406. In decision block 406, a decision is made whether a fault has been detected affecting the main ΣΔ ADC. As an example, the fault may be in an input to the main ΣΔ ADC. As another example, the fault may be in the main ΣΔ ADC itself. If no fault has been detected, method 400 returns to block 402. If a fault has been detected, method 400 continues to block 407. In block 407, a response to the detected fault is performed. The response may be, for example, providing an indication of the detected fault or, as another example, performing remedial action in response to the detected fault.

Figure 5:
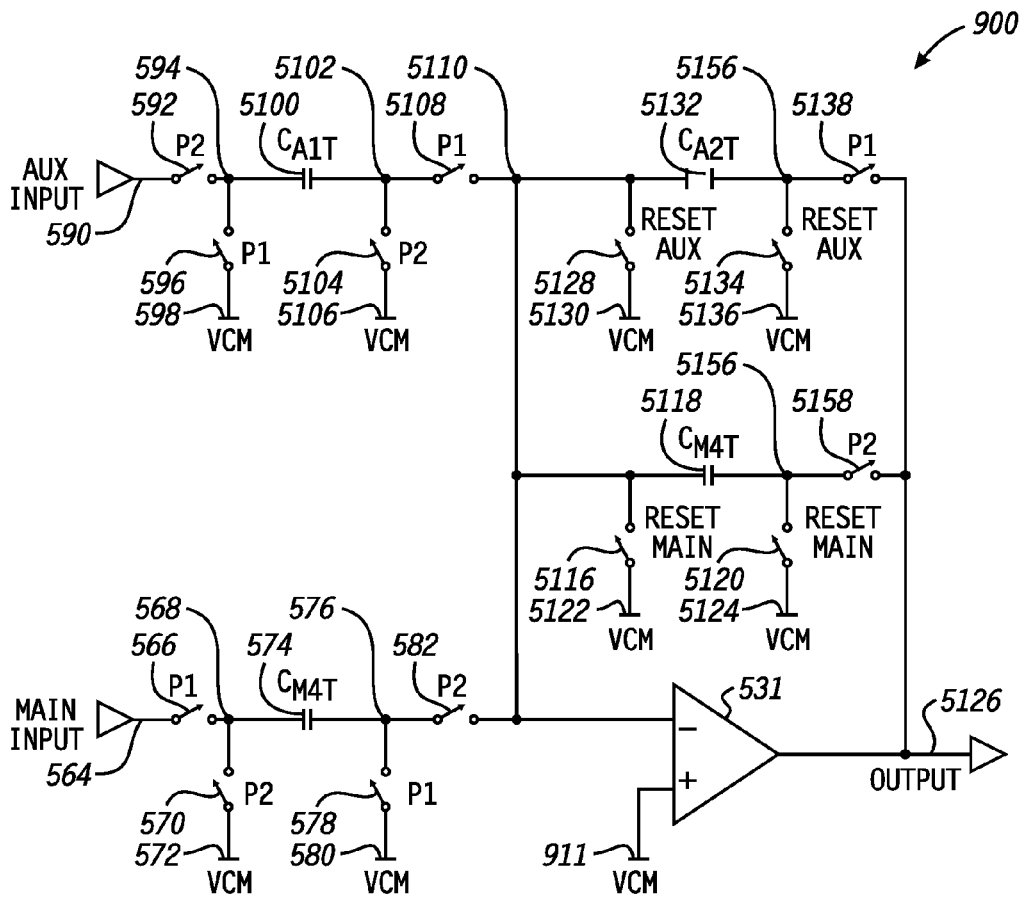
FIG. 5 is a schematic diagram illustrating a circuit for sharing an integrator amplifier between two sigma-delta modulators in accordance with at least one embodiment.

FIG. 5 is a schematic diagram illustrating a circuit for sharing an integrator amplifier between two sigma-delta modulators in accordance with at least one embodiment. The sharing of an integrator amplifier between two sigma-delta modulators can be accomplished using a switched capacitor technique. As a switched capacitor circuit can be implemented to provide a first switch state and a second switch state, the functions performed in each switch state for a first set of signals can be complemented by opposite functions being performed simultaneously for a second set of signals. The first switch state and the second switch state can be controlled by a control signal, which can be a periodic signal in the nature of a clock signal. Duplication of switches and switched elements, such as capacitors, can allow an integrator amplifier to be shared between a main sigma-delta modulator and an auxiliary sigma-delta modulator such that duplication of the integrator amplifier can be avoided.

The schematic diagram of FIG. 5 shows simplified circuit 900 to illustrate an example of a circuit configured to share an integrator amplifier between a main signal path and an auxiliary signal path. As an example, the main signal path can be the signal path of a main sigma-delta modulator, and the auxiliary signal path can be the signal path of an auxiliary sigma-delta modulator.

A main input signal is received at main input 564. Main input 564 is connected to a first terminal of switch 566. A second terminal of switch 566 is connected to node 568, which is connected to a first terminal of switch 570 and to a first terminal of capacitor 574. A second terminal of switch 570 is connected to common mode voltage 572. A second terminal of capacitor 574 is connected to node 576, which is connected to a first terminal of switch 578 and to a first terminal of switch 582. A second terminal of switch 578 is connected to common mode voltage 580. A second terminal of switch 582 is connected to node 5110, which is connected to an inverting input of integrator amplifier 531, to a first terminal of switch 5116, to a first terminal of capacitor 5118, to a second terminal of switch 5108, to a first terminal of switch 5128, and to a first terminal of capacitor 5132. A second terminal of switch 5116 is connected to common mode voltage 5122. A second terminal of capacitor 5118 is connected to a first terminal of switch 5120 and to a first terminal of switch 5158. A second terminal of switch 5120 is connected to common mode voltage 5124. A second terminal of switch 5158 is connected to output 5126, which is connected to an output of integrator amplifier 531. A non-inverting input of integrator amplifier 531 is connected to common mode voltage 911.

An auxiliary input signal is received at auxiliary input 590. Auxiliary input 590 is connected to a first terminal of switch 592. A second terminal of switch 592 is connected to node 594, which is connected to a first terminal of switch 596 and to a first terminal of capacitor 5100. A second terminal of switch 596 is connected to common mode voltage 598. A second terminal of capacitor 5100 is connected to node 5102, which is connected to a first terminal of switch 5104 and to a first terminal of switch 5108. A second terminal of switch 5104 is connected to common mode voltage 5106. A second terminal of switch 5108 is connected to node 5110, which is connected to an inverting input of integrator amplifier 531, to a second terminal of switch 582, to a first terminal of switch 5116, to a first terminal of capacitor 5118, to a first terminal of switch 5128, and to a first terminal of capacitor 5132. A second terminal of switch 5128 is connected to common mode voltage 5130. A second terminal of capacitor 5132 is connected to a first terminal of switch 5134 and to a first terminal of switch 5138. A second terminal of switch 5134 is connected to common mode voltage 5136. A second terminal of switch 5138 is connected to output 5126, which is connected to an output of integrator amplifier 531.

By controlling the phases of the switches to alternately charge and discharge the capacitors, paths to, and in feedback loops around, integrator amplifier 531 can be provided for a main signal and an auxiliary signal. As a switch is configured to charge a capacitor in the main path, another switch can be configured for the auxiliary path to be integrating, thereby efficiently sharing the integrator amplifier in alternating short segments of time.

Simplified circuit 900 is shown as a single-ended circuit but can be implemented as a differential circuit as shown in other illustrative embodiments. Simplified circuit 900 is shown using a single integrator amplifier stage but can be implemented using a greater number of integrator amplifier stages as shown in other illustrative embodiments. Simplified circuit 900 is shown using a two-input integrator amplifier but can be implemented using other integrator amplifier configurations, such as a four-input integrator amplifier as shown in other illustrative embodiments. Simplified circuit 900 is shown as having non-multiplexed inputs but can be implemented to have multiplexed inputs as shown in other illustrative embodiments. Simplified circuit 900 is shown as having a single output but can be implemented to have multiple outputs, for example, a main sigma-delta modulator output and an auxiliary sigma-delta modulator output, for example, by switching output 5126 according to the signal present at that node.

Figure 6:
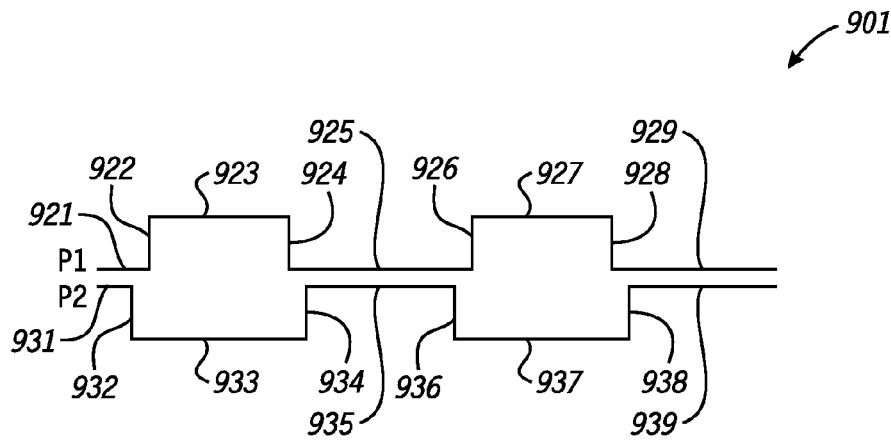
FIG. 6 is a timing diagram illustrating clock phases of clock signals for operating the circuit of FIG. 5 in accordance with at least one embodiment.

FIG. 6 is a timing diagram illustrating clock phases of clock signals for operating the circuit of FIG. 5 in accordance with at least one embodiment. Timing diagram 901 shows a first clock signal 921 of a first phase and a second clock signal 931 of a second phase. As an example, the first clock signal can be used to control the positions of switches 566, 5108, 578, 596, and 5138 of FIG. 5, and the second clock signal can be used to control the positions of switches 592, 582, 570, 5104, and 5158 of FIG. 5. The first phase and the second phase are practically opposite (e.g., but with non-overlapping periods to ensure that charge is not inadvertently lost due to switch operation), thereby allowing alternating use of integrator amplifier 531 for a main path and an auxiliary path.

First clock signal 921 is shown as beginning at a low logic level, rising to a high logic level at a rising edge 922, remaining at a high logic level 923, falling to a low logic level at a falling edge 924, remaining at low logic level 925, rising to a high logic level at rising edge 926, remaining at a high logic level 927, falling to a low logic level at falling edge 928, and remaining at a low logic level 929. During the same time, second clock signal 931 is shown as beginning at a high logic level, falling to a low logic level at a falling edge 932, remaining at a low logic level 933, rising to a high logic level at a rising edge 934, remaining at high logic level 935, falling to a low logic level at falling edge 936, remaining at a low logic level 937, rising to a high logic level at rising edge 938, and remaining at a high logic level 939. As can be seen, to provide break-before-make switching to provide isolation of the main path from the auxiliary path, rising edge 922 occurs slightly after falling edge 932, falling edge 924 occurs slightly before rising edge 934, rising edge 926 occurs slightly after falling edge 936, and falling edge 928 occurs slightly before rising edge 938.

Figure 7:
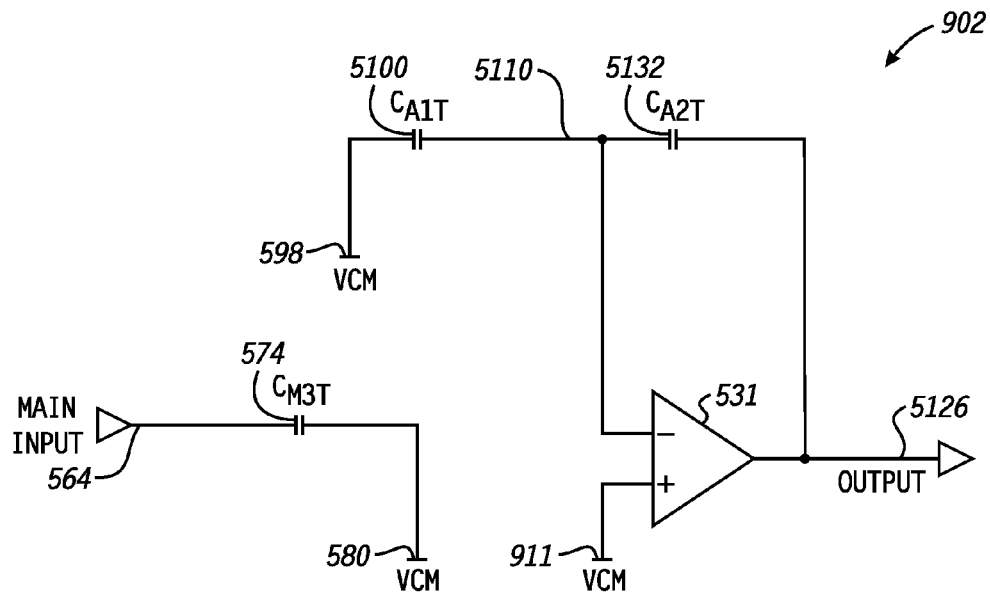
FIG. 7 is a schematic diagram illustrating an equivalent circuit for the circuit of FIG. 5 during the first clock phase of FIG. 6 in accordance with at least one embodiment.

FIG. 7 is a schematic diagram illustrating an equivalent circuit for the circuit of FIG. 5 during the first clock phase of FIG. 6 in accordance with at least one embodiment. When the circuit of FIG. 5 is has its switches configured in positions reflecting closure according to a first clock phase, it is equivalent to circuit 902. Main input 564 is connected to the first terminal of capacitor 574. The second terminal of capacitor 574 is connected to common mode voltage 580. The first terminal of capacitor 5100 is connected to common mode voltage 598. The second terminal of capacitor 5100 is connected to node 5110, which is connected to the first terminal of capacitor 5132 and to an inverting input of integrator amplifier 531. A non-inverting input of integrator amplifier 531 is connected to common mode voltage 911. A second terminal of capacitor 5132 is connected to the output of integrator amplifier 531 and to output 5126.

Main input 564 applies a voltage to charge capacitor 574 relative to common mode voltage 580. A voltage of capacitor 5100 relative to common mode voltage 598 based on capacitor 5100 having previously been charged from auxiliary input 590 is applied to the inverting input of integrator amplifier 531 with capacitor 5132 in the feedback loop of integrator amplifier 531. Thus, output 5126 provides output representative of integration of the auxiliary signal.

Figure 8:
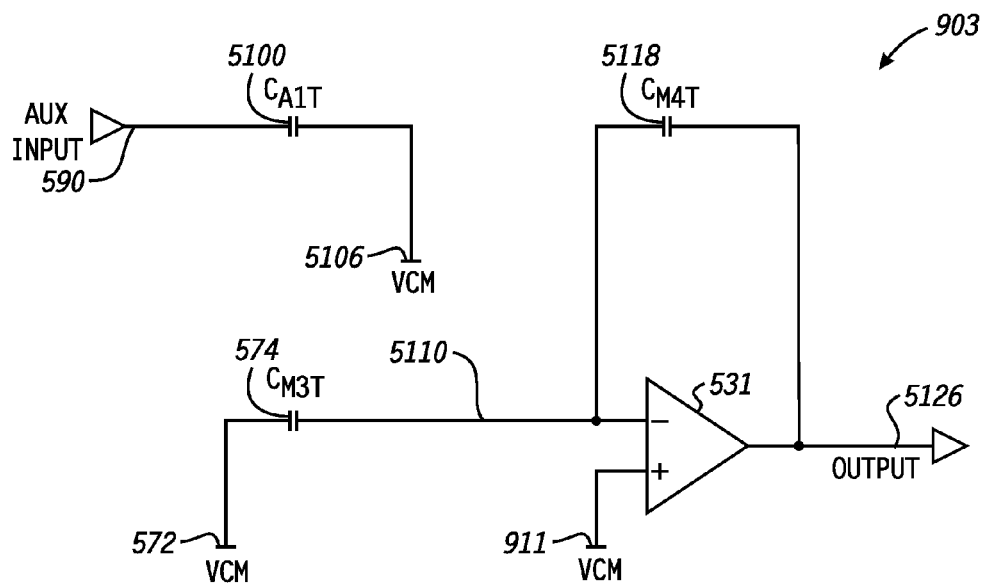
FIG. 8 is a schematic diagram illustrating an equivalent circuit for the circuit of FIG. 5 during the second clock phase of FIG. 6 in accordance with at least one embodiment.

FIG. 8 is a schematic diagram illustrating an equivalent circuit for the circuit of FIG. 5 during the second clock phase of FIG. 6 in accordance with at least one embodiment. When the circuit of FIG. 5 has its switches configured in positions reflecting closure according to a second clock phase, it is equivalent to circuit 903. Auxiliary input 590 is connected to the first terminal of capacitor 5100. The second terminal of capacitor 5100 is connected to common mode voltage 5106. The first terminal of capacitor 574 is connected to common mode voltage 572. The second terminal of capacitor 574 is connected to node 5110, which is connected to the first terminal of capacitor 5118 and to an inverting input of integrator amplifier 531. A non-inverting input of integrator amplifier 531 is connected to common mode voltage 911. A second terminal of capacitor 5118 is connected to the output of integrator amplifier 531 and to output 5126.

Auxiliary input 590 applies a voltage to charge capacitor 5100 relative to common mode voltage 5106. A voltage of capacitor 574 relative to common mode voltage 572 based on capacitor 574 having previously been charged from main input 564 is applied to the inverting input of integrator amplifier 531 with capacitor 5118 in the feedback loop of integrator amplifier 531. Thus, output 5126 provides output representative of integration of the main signal.

Figure 9:
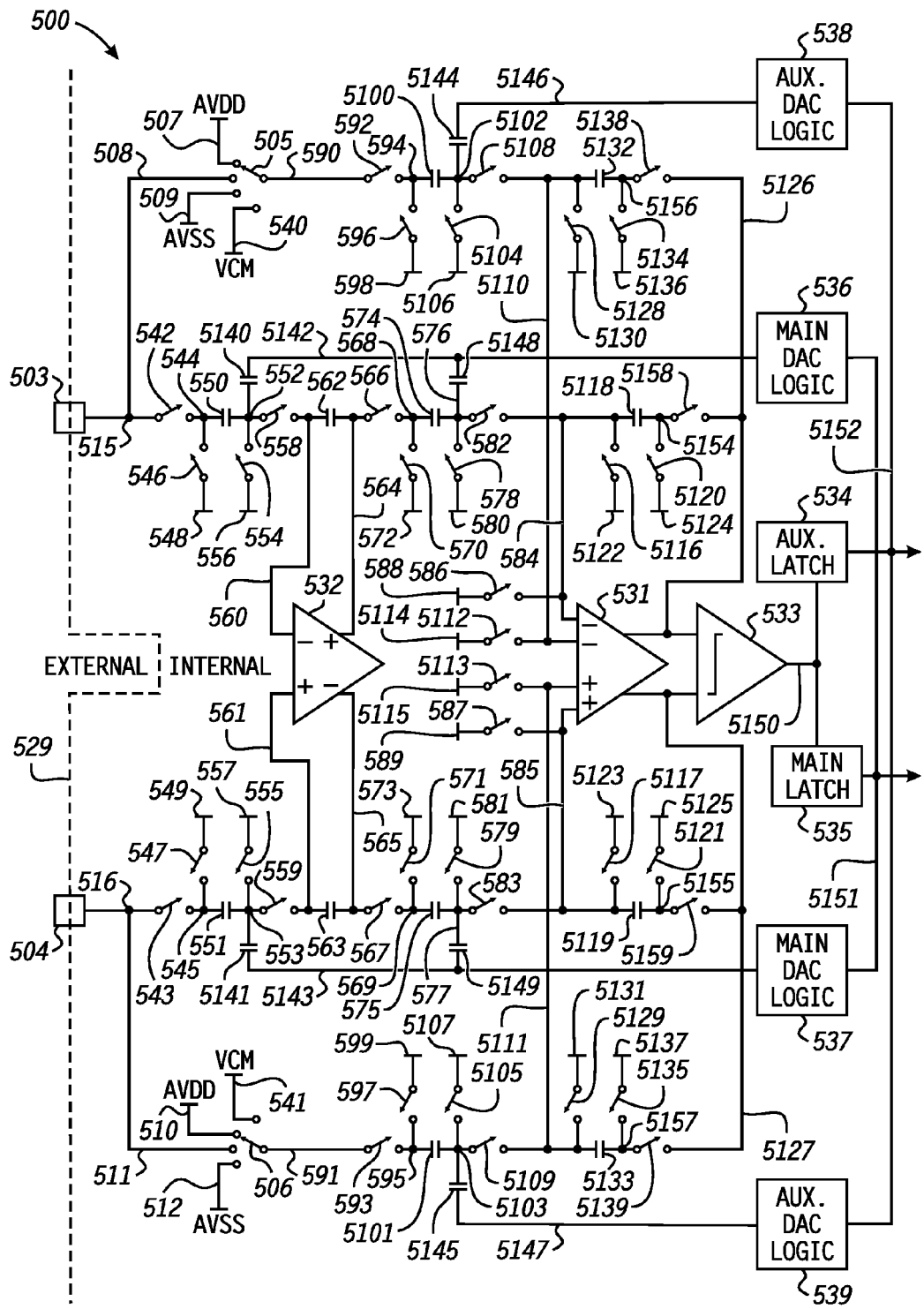
FIG. 9 is a schematic diagram illustrating a dual sigma-delta analog-to-digital converter in accordance with at least one embodiment.

FIG. 9 is a schematic diagram illustrating a dual sigma-delta analog-to-digital converter in accordance with at least one embodiment. Dual ΣΔ ADC 500 comprises a main ΣΔ modulator and an auxiliary ΣΔ modulator. Dual ΣΔ ADC 500 comprises a plurality of switches to selectively communicatively couple elements within dual ΣΔ ADC 500 to operate as a functional portion of the main ΣΔ modulator or as a functional portion of the auxiliary ΣΔ modulator.

A boundary 529 exists between an exterior environment and an interior environment. Pads 503 and 504 provide interconnects across boundary 529. Pad 503 is connected to node 515. Node 515 is connected to switch terminal 508 of first input switch 505. A first supply voltage, for example, a first positive supply voltage, such as an AVDD positive supply voltage, is connected to switch terminal 507 of first input switch 505. A second supply voltage, for example, a second negative supply voltage, such as an AVSS negative supply voltage, is connected to switch terminal 209 of first input switch 505. A reference voltage, for example, a VCM reference voltage, is connected to switch terminal 540 of first input switch 505. Node 515 is connected to a first terminal of switch 542. A second terminal of switch 542 is connected to node 544, which is connected to a first terminal of switch 546 and to a first terminal of capacitor 550. A second terminal of switch 546 is connected to common mode voltage 548. A second terminal of capacitor 550 is connected to node 552, which is connected to a first terminal of capacitor 5140, to a first terminal of switch 558, and to a first terminal of switch 554. A second terminal of switch 554 is connected to common mode voltage 556. A second terminal of capacitor 5140 is connected to an output of main DAC logic block 536.

A second terminal of switch 558 is connected to node 260, which is connected to a negative input of first integrator 532 and to a first terminal of capacitor 562. A positive output of first integrator 532 is connected to node 564, which is connected to a second terminal of capacitor 562 and to a first terminal of switch 566. A second terminal of switch 566 is connected to node 568, which is connected to a first terminal of switch 570 and to a first terminal of capacitor 574. A second terminal of switch 570 is connected to common mode voltage 572. A second terminal of capacitor 574 is connected to node 576. Node 576 is connected to a first terminal of switch 578, to a first terminal of switch 582, and to a first terminal of capacitor 5148. A second terminal of switch 578 is connected to common mode voltage 580. A second terminal of capacitor 5148 is connected to an output of main DAC logic block 536. A second terminal of switch 582 is connected to node 584. Node 584 is connected to a first negative input of second integrator 531, to a first terminal of switch 586, to a first terminal of switch 5116, and to a first terminal of capacitor 5118. A second terminal of switch 586 is connected to common mode voltage 588. A second terminal of switch 5116 is connected to common mode voltage 5122. A second terminal of capacitor 5118 is connected to node 5154, which is connected to a first terminal of switch 5120 and to a first terminal of switch 5158. A second terminal of switch 5120 is connected to common mode voltage 5124. A second terminal of switch 5158 is connected to node 5126, which is connected to a first output of second integrator 531, to a first input of comparator 533, and to a second terminal of switch 5138.

Pad 504 is connected to node 516. Node 516 is connected to switch terminal 511 of second input switch 506. A first supply voltage, for example, a first positive supply voltage, such as an AVDD positive supply voltage, is connected to switch terminal 510 of second input switch 506. A second supply voltage, for example, a second negative supply voltage, such as an AVSS negative supply voltage, is connected to switch terminal 512 of second input switch 506. A reference voltage, for example, a VCM reference voltage, is connected to switch terminal 541 of second input switch 506. Node 516 is connected to a first terminal of switch 543. A second terminal of switch 543 is connected to node 545, which is connected to a first terminal of switch 547 and to a first terminal of capacitor 551. A second terminal of switch 547 is connected to common mode voltage 549. A second terminal of capacitor 551 is connected to node 553, which is connected to a first terminal of capacitor 5141, to a first terminal of switch 559, and to a first terminal of switch 555. A second terminal of switch 555 is connected to common mode voltage 557. A second terminal of capacitor 5141 is connected to an output of main DAC logic block 537.

A second terminal of switch 559 is connected to node 261, which is connected to a positive input of first integrator 532 and to a first terminal of capacitor 563. A negative output of first integrator 532 is connected to node 565, which is connected to a second terminal of capacitor 563 and to a first terminal of switch 567. A second terminal of switch 567 is connected to node 569, which is connected to a first terminal of switch 571 and to a first terminal of capacitor 575. A second terminal of switch 571 is connected to common mode voltage 573. A second terminal of capacitor 575 is connected to node 577. Node 577 is connected to a first terminal of switch 579, to a first terminal of switch 583, and to a first terminal of capacitor 5149. A second terminal of switch 579 is connected to common mode voltage 581. A second terminal of capacitor 5149 is connected to an output of main DAC logic 537. A second terminal of switch 583 is connected to node 585. Node 585 is connected to a first positive input of second integrator 531, to a first terminal of switch 587, to a first terminal of switch 5117, and to a first terminal of capacitor 5119. A second terminal of switch 587 is connected to common mode voltage 589. A second terminal of switch 5117 is connected to common mode voltage 5123. A second terminal of capacitor 5119 is connected to node 5155, which is connected to a first terminal of switch 5121 and to a first terminal of switch 5159. A second terminal of switch 5121 is connected to common mode voltage 5125. A second terminal of switch 5159 is connected to node 5127, which is connected to a second output of second integrator 531, to a second input of comparator 533, and to a second terminal of switch 5139.

A common switch terminal of first input switch 505 is connected to a first terminal of switch 592. A second terminal of switch 592 is connected to node 594, which is connected to a first terminal of switch 596 and to a first terminal of capacitor 5100. A second terminal of switch 596 is connected to common mode voltage 598. A second terminal of capacitor 5100 is connected to node 5102, which is connected to a first terminal of switch 5104, to a first terminal of switch 5108, and to a first terminal of capacitor 5144. A second terminal of switch 5104 is connected to common mode voltage 5106. A second terminal of capacitor 5144 is connected to node 5146, which is connected to an output of auxiliary DAC logic block 538. A second terminal of switch 5108 is connected to node 5110, which is connected to a second negative input of second integrator 531, to a first terminal of switch 5112, to a first terminal of switch 5128, and to a first terminal of capacitor 5132. A second terminal of switch 5112 is connected to common mode voltage 5114. A second terminal of switch 5128 is connected to common mode voltage 5130. A second terminal of capacitor 5132 is connected to node 5156, which is connected to a first terminal of switch 5134 and to a first terminal of switch 5138. A second terminal of switch 5134 is connected to common mode voltage 5136. A second terminal of switch 5138 is connected to node 5126, which is connected to a first output of second integrator 531, to a first input of comparator 533, and to a second terminal of switch 5158.

A common switch terminal of second input switch 506 is connected to a first terminal of switch 593. A second terminal of switch 593 is connected to node 595, which is connected to a first terminal of switch 597 and to a first terminal of capacitor 5101. A second terminal of switch 597 is connected to common mode voltage 599. A second terminal of capacitor 5101 is connected to node 5103, which is connected to a first terminal of switch 5105, to a first terminal of switch 5109, and to a first terminal of capacitor 5145. A second terminal of switch 5105 is connected to common mode voltage 5107. A second terminal of capacitor 5145 is connected to node 5147, which is connected to an output of auxiliary DAC logic block 539. A second terminal of switch 5109 is connected to node 5111, which is connected to a second positive input of second integrator 531, to a first terminal of switch 5113, to a first terminal of switch 5129, and to a first terminal of capacitor 5133. A second terminal of switch 5113 is connected to common mode voltage 5115. A second terminal of switch 5129 is connected to common mode voltage 5131. A second terminal of capacitor 5133 is connected to node 5157, which is connected to a first terminal of switch 5135 and to a first terminal of switch 5139. A second terminal of switch 5135 is connected to common mode voltage 5137. A second terminal of switch 5139 is connected to node 5127, which is connected to a second output of second integrator 531, to a second input of comparator 533, and to a second terminal of switch 5159.

An output of comparator 533 is connected to an input of main latch 535 and to an input of auxiliary latch 534. An output of main latch 535 is connected to an input of main DAC logic block 536, to an input of main DAC logic block 537, and to a main output 5151 of dual ΣΔ ADC 500. An output of auxiliary latch 534 is connected to an input of auxiliary DAC logic block 538, to an input of auxiliary DAC logic block 539, and to an auxiliary output 5152 of dual ΣΔ ADC 500. While comparator 533 is shown as a single comparator shared between the main and auxiliary ΣΔ ADC circuitry, comparator 533 may instead be implemented as separate comparators, for example, one for the main ΣΔ ADC circuitry and another for the auxiliary ΣΔ ADC circuitry.

As an example, one or both of integrators 532 and 531 can be implemented using amplifiers. For example, to implement an integrator using a four-input amplifier, as integrator 531 is shown in FIG. 9, Freescale technology, such as that described in U.S. Pat. No. 7,449,923 B2, "Amplifier Circuit for Double Sampled Architectures," issued to Brandt Braswell et al., and incorporated herein by reference, may be used. As another example, Freescale technology, such as that described in U.S. Pat. No. 8,339,302 B2, "Analog-to-Digital Converter Having a Comparator for a Multi-Stage Sampling Circuit and Method Therefor," issued to Mohammad Nizam Kabir, and incorporated herein by reference, may be used.

Figure 10:
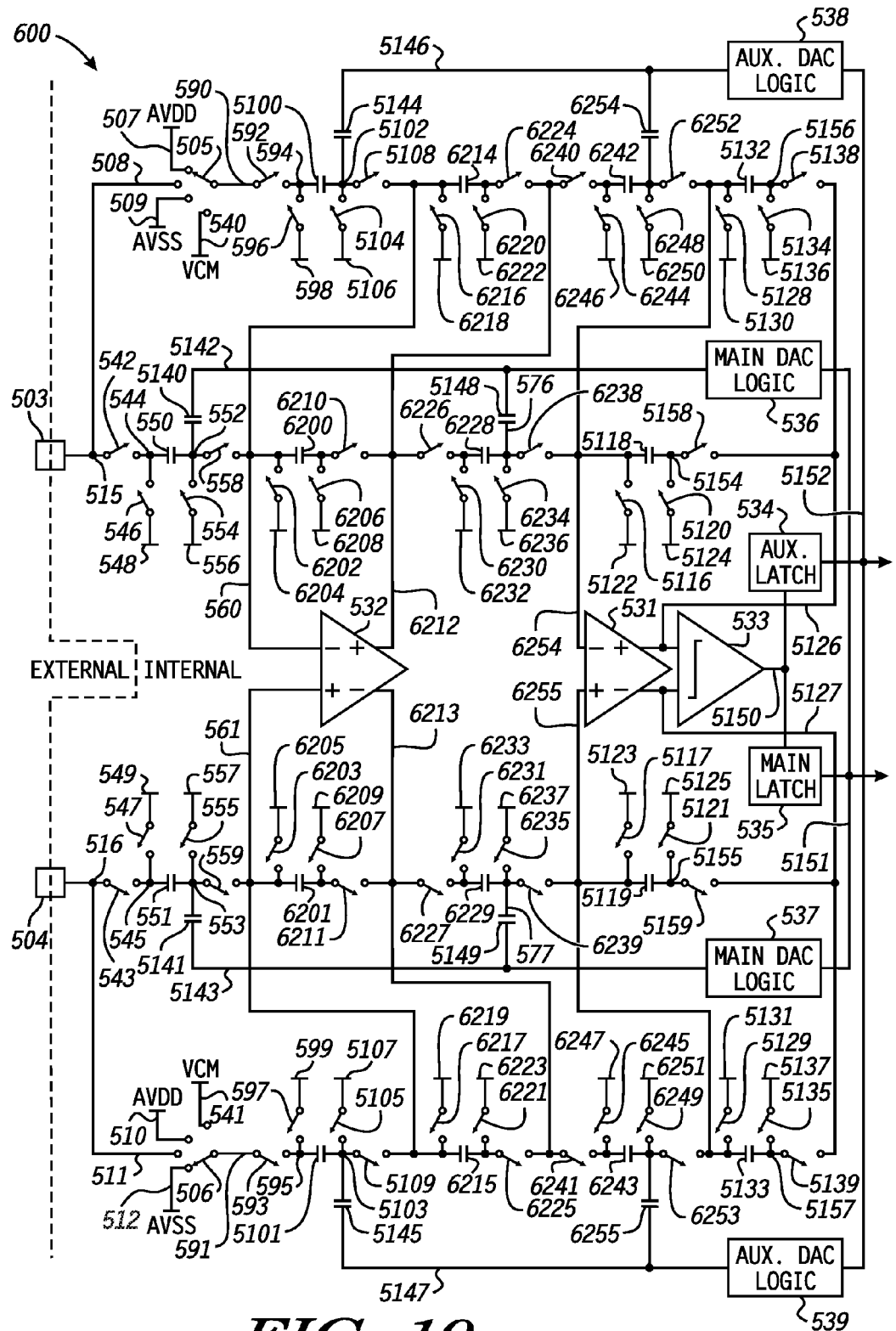
FIG. 10 is a schematic diagram illustrating a dual sigma-delta analog-to-digital converter comprising a second-order main sigma-delta modulator and a second-order auxiliary sigma-delta modulator that share two integrator stages in accordance with at least one embodiment.

FIG. 10 is a schematic diagram illustrating a dual sigma-delta analog-to-digital converter comprising a second-order main sigma-delta modulator and a second-order auxiliary sigma-delta modulator that share two integrator stages in accordance with at least one embodiment. Dual ΣΔ ADC 600 is similar in many respects to dual ΣΔ ADC 500, and, to avoid repetition, differences between dual ΣΔ ADC 600 and dual ΣΔ ADC 500 will be described below. Instead of capacitor 562, dual ΣΔ ADC 600 comprises two switchable capacitor sections. One switchable capacitor section comprises capacitor 6200, switch 6202, common mode voltage 6204, switch 6206, common mode voltage 6208, and switch 6210. A first terminal of capacitor 6200 is connected to node 560, where the first terminal of capacitor 562 would otherwise be connected, and to a first terminal of switch 6202. A second terminal of switch 6202 is connected to common mode voltage 6204. A second terminal of capacitor 6200 is connected to a first terminal of switch 6206 and to a first terminal of switch 6210. A second terminal of switch 6206 is connected to common mode voltage 6208. A second terminal of switch 6210 is connected to node 6212. Node 6212 is connected to a positive output of first integrator 532, to a second terminal of switch 6224, to a first terminal of switch 6240, and to a first terminal of switch 6226.

The other switchable capacitor section comprises capacitor 6214, switch 6216, common mode voltage 6218, switch 6220, common mode voltage 6222, and switch 6224. A first terminal of capacitor 6214 is connected to node 560, where the first terminal of capacitor 562 would otherwise be connected, and to a first terminal of switch 6216. A second terminal of switch 6216 is connected to common mode voltage 6218. A second terminal of capacitor 6214 is connected to a first terminal of switch 6220 and to a first terminal of switch 6224. A second terminal of switch 6220 is connected to common mode voltage 6222. A second terminal of switch 6224 is connected to node 6212.

Instead of capacitor 563, dual ΣΔ ADC 600 comprises two switchable capacitor sections. A first terminal of capacitor 6201 is connected to node 561, where the first terminal of capacitor 563 would otherwise be connected, and to a first terminal of switch 6203. A second terminal of switch 6203 is connected to common mode voltage 6205. A second terminal of capacitor 6201 is connected to a first terminal of switch 6207 and to a first terminal of switch 6211. A second terminal of switch 6207 is connected to common mode voltage 6209. A second terminal of switch 6211 is connected to node 6213. Node 6213 is connected to the negative output of first integrator 532, to a second terminal of switch 6225, to a first terminal of switch 6241, and to a first terminal of switch 6227.

The other switchable capacitor section comprises capacitor 6215, switch 6217, common mode voltage 6219, switch 6221, common mode voltage 6223, and switch 6225. A first terminal of capacitor 6215 is connected to node 561, where the first terminal of capacitor 563 would otherwise be connected, and to a first terminal of switch 6217. A second terminal of switch 6217 is connected to common mode voltage 6219. A second terminal of capacitor 6215 is connected to a first terminal of switch 6221 and to a first terminal of switch 6225. A second terminal of switch 6221 is connected to common mode voltage 6223. A second terminal of switch 6225 is connected to node 6213.

Instead of the switchable capacitor section comprising capacitor 5118 and switches 5116, 5120, and 5158 and the switchable capacitor section comprising capacitor 5132 and switches 5128, 5134, and 5138, dual ΣΔ ADC 600 comprises two other switchable capacitor sections. One switchable capacitor section comprises capacitor 6228 and switches 6226, 6230, 6234, and 6238. A first terminal of switch 6226 is connected to node 6212. A second terminal of switch 6226 is connected to a first terminal of capacitor 6228 and to a first terminal of switch 6230. A second terminal of switch 6230 is connected to common mode voltage 6232. A second terminal of capacitor 6228 is connected to a first terminal of switch 6234, to a first terminal of switch 6238, and to a first terminal of capacitor 5148. A second terminal of switch 6238 is connected to node 6254, which is connected to a first positive input of second integrator 531. Second integrator 531 need not be a four-input integrator, as shown in FIG. 9, but may be implemented with a two-input integrator, as shown in FIG. 10. What would otherwise have been nodes 584 and 5110 can be combined into node 6254, as shown in FIG. 10.

The other switchable capacitor section comprises capacitor 6242 and switches 6240, 6244, 6248, and 6252. A first terminal of switch 6240 is connected to node 6212. A second terminal of switch 6240 is connected to a first terminal of capacitor 6242 and to a first terminal of switch 6244. A second terminal of switch 6244 is connected to common mode voltage 6246. A second terminal of capacitor 6242 is connected to a first terminal of switch 6248, to a first terminal of switch 6252, and to a first terminal of capacitor 6254. A second terminal of switch 6252 is connected to node 6254, which is connected to the first positive input of second integrator 531.

Instead of the switchable capacitor section comprising capacitor 5119 and switches 5117, 5121, and 5159 and the switchable capacitor section comprising capacitor 5133 and switches 5129, 5135, and 5139, dual ΣΔ ADC 600 comprises two other switchable capacitor sections. One switchable capacitor section comprises capacitor 6229 and switches 6227, 6231, 6235, and 6239. A first terminal of switch 6227 is connected to node 6213. A second terminal of switch 6227 is connected to a first terminal of capacitor 6229 and to a first terminal of switch 6231. A second terminal of switch 6231 is connected to common mode voltage 6233. A second terminal of capacitor 6229 is connected to a first terminal of switch 6235, to a first terminal of switch 6239, and to a first terminal of capacitor 5149. A second terminal of switch 6239 is connected to node 6255, which is connected to a second positive input of second integrator 531. Second integrator 531 need not be a four-input integrator, as shown in FIG. 9, but may be implemented with a two-input integrator, as shown in FIG. 10. What would otherwise have been nodes 585 and 5111 can be combined into node 6255, as shown in FIG. 10.

The other switchable capacitor section comprises capacitor 6243 and switches 6241, 6245, 6249, and 6253. A first terminal of switch 6241 is connected to node 6213. A second terminal of switch 6241 is connected to a first terminal of capacitor 6243 and to a first terminal of switch 6245. A second terminal of switch 6245 is connected to common mode voltage 6247. A second terminal of capacitor 6243 is connected to a first terminal of switch 6249, to a first terminal of switch 6253, and to a first terminal of capacitor 6255. A second terminal of switch 6253 is connected to node 6255, which is connected to the second positive input of second integrator 531.

Figure 11:
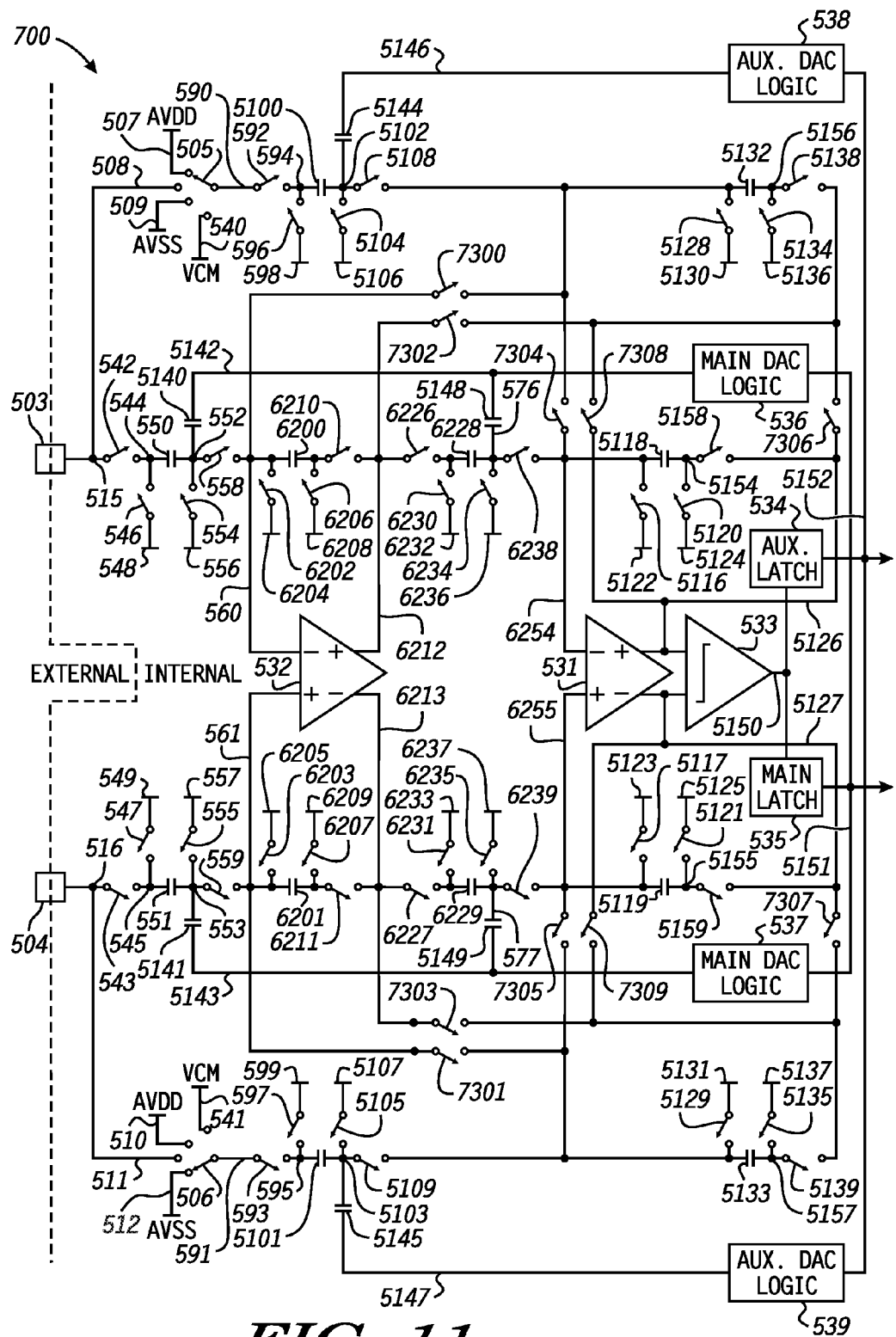
FIG. 11 is a schematic diagram illustrating a dual sigma-delta analog-to-digital converter comprising a second-order main sigma-delta modulator and a first-order auxiliary sigma-delta modulator that share an integrator stage in accordance with at least one embodiment.

FIG. 11 is a schematic diagram illustrating a dual sigma-delta analog-to-digital converter comprising a second-order main sigma-delta modulator and a first-order auxiliary sigma-delta modulator that share an integrator stage in accordance with at least one embodiment. Dual ΣΔ ADC 700 is similar in many respects to dual ΣΔ ADC 600, and, to avoid repetition, differences between dual ΣΔ ADC 700 and dual ΣΔ ADC 600 will be described below. Instead of the switchable capacitor section comprising capacitor 6214 and switches 6216, 6220, and 6224, switch 7300 is provided with a first terminal connected to a second terminal of switch 558, to the negative input terminal of first integrator 532, to the first terminal of capacitor 6200, and to the first terminal of switch 6202. A second terminal of switch 7300 is connected to the second terminal of switch 5108, to the first terminal of switch 5128, to the first terminal of capacitor 5132, and to a first terminal of switch 7304. The second terminal of switch 7304 is connected to the second terminal of switch 6238, to the negative input of second integrator 531, to the first terminal of switch 5116, and to the first terminal of capacitor 5118. Instead of the switchable capacitor section comprising capacitor 6215 and switches 6217, 6221, and 6225, switch 7301 is provided with a first terminal connected to a second terminal of switch 559, to the positive input terminal of first integrator 532, to the first terminal of capacitor 6201, and to the first terminal of switch 6203. A second terminal of switch 7301 is connected to the second terminal of switch 5109, to the first terminal of switch 5129, to the first terminal of capacitor 5133, and to a first terminal of switch 7305. The second terminal of switch 7305 is connected to the second terminal of switch 6239, to the positive input of second integrator 531, to the first terminal of switch 5117, and to the first terminal of capacitor 5119.

Instead of the switchable capacitor section comprising capacitor 6242 and switches 6240, 6244, 6248, and 6252, switch 7302 is provided with a first terminal connected to node 6212 and a second terminal connected to the second terminal of switch 5158, to a first terminal of switch 7306, and to a first terminal of switch 7308. The second terminal of switch 7306 and the second terminal of switch 7308 are connected to each other and to the second terminal of switch 5158, to the second terminal of positive output of second integrator 531, and to the first input of comparator 533. Instead of the switchable capacitor section comprising capacitor 6243 and switches 6241, 6245, 6249, and 6253, switch 7303 is provided with a first terminal connected to node 6213 and a second terminal connected to the second terminal of switch 5159, to a first terminal of switch 7307, and to a first terminal of switch 7309. The second terminal of switch 7307 and the second terminal of switch 7309 are connected to each other and to the second terminal of switch 5159, to the second terminal of negative output of second integrator 531, and to the second input of comparator 533.

Figure 12:
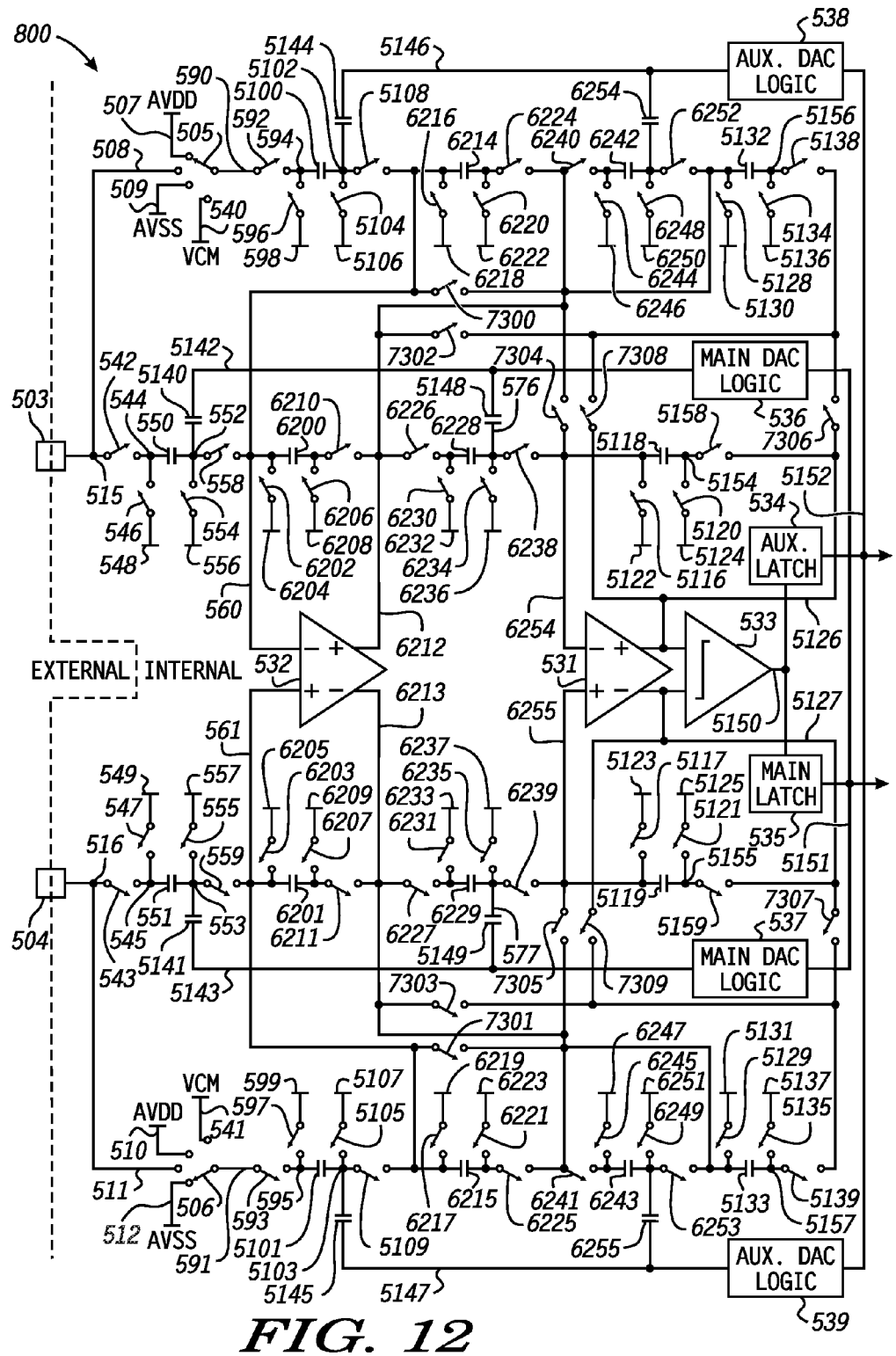
FIG. 12 is a schematic diagram illustrating a dual sigma-delta analog-to-digital converter comprising a second-order main sigma-delta modulator and either a first-order or second-order auxiliary sigma-delta modulator that share a corresponding number of integrator stages in accordance with at least one embodiment.

FIG. 12 is a schematic diagram illustrating a dual sigma-delta analog-to-digital converter comprising a second-order main sigma-delta modulator and either a first-order or second-order auxiliary sigma-delta modulator that share a corresponding number of integrator stages in accordance with at least one embodiment. Dual ΣΔ ADC 800 is similar in many respects to dual ΣΔ ADC 600 and dual ΣΔ ADC 700, as it can provide the configuration of both of dual ΣΔ ADC 600 and dual ΣΔ ADC 700. In order to support the range of configuration options provided by dual ΣΔ ADC 800, dual ΣΔ ADC 800 retains the elements of dual ΣΔ ADC 600 and adds the additional switches of dual ΣΔ ADC 700. The additional switches can be used to selectively bypass either an integrator section to provide a single integrator, as opposed to both integrators, if a first-order auxiliary ΣΔ modulator, as opposed to a second-order auxiliary ΣΔ modulator, is desired. Alternatively, the additional switches can be opened to configure dual ΣΔ ADC 800 to operate as dual ΣΔ ADC 600.

In accordance with at least one embodiment, an independent auxiliary sigma-delta ADC is implemented along with a general purpose sigma-delta ADC using many of the same components so that very little extra area and almost no extra power are required. The auxiliary sigma-delta ADC can be used to perform run-time diagnostics while the main ADC is being used normally in an application. In one exemplary context, sigma-delta ADCs used in resolver-to-digital converter (RDC), power train, and other automotive applications can use the auxiliary ΣΔ ADC to effectively and efficiently perform run-time diagnostics (e.g., open or short between a supply voltage, ground, other input, etc., as well as basic ADC functionality) with minimal extra circuitry, area, and power and no extra loading of the circuitry that is driving the ADC. For example, an auxiliary first-order modulator, using the same first or second integrator as the main second-order modulator, can be used to detect whether the inputs of the main ΣΔ ADC are shorted to a reference voltage VCM, a positive supply voltage VDD, or a negative supply voltage VSS, or whether they are open. The first-order auxiliary modulator can also be used to check/monitor the functionality of the main second-order modulator during normal operation. The first-order auxiliary modulator can also be used to monitor the on-die temperature as determined by any number of on-die temperature sensors without requiring a separate ADC for each temperature sensor. The first-order auxiliary modulator inputs can be rotated on a regular basis between the normal input, positive supply voltage AVDD, negative supply voltage AVSS, common mode voltage VCM, and other inputs, such as a signal representative of a temperature so that opens, shorts and other faults on either main ADC input can be detected and other analog input signals can be converted.

Along with sharing one or more integrator stages, a comparator stage can also be shared between the main ΣΔ ADC and the auxiliary ΣΔ ADC. The dual ΣΔ ADC can be verified by comparing two implementations of the quantizer, a first of which provides two comparators (one for the main ΣΔ ADC and one for the auxiliary ΣΔ ADC) and a second of which provides one comparator shared by the main and auxiliary modulators. When the auxiliary ΣΔ ADC is used for operational monitoring of the main ΣΔ ADC, the auxiliary ΣΔ ADC can be used to detect many different types of faults, such as both inputs being shorted to another voltage, such as VCM, AVSS, or AVDD, one input being shorted to one voltage, such as VCM, and the other input is shorted to another voltage, such as AVDD or AVSS, one input being shorted to one supply voltage, such as AVDD and the other input is shorted to another supply voltage, such as AVSS, and one input being open. For cases where the inputs are not shorted together, an anomalous output pattern can be detected based on the modulator coefficients. For the case of the inputs being shorted together, the fault can be detected by observing that the output is always the same. By selectively configuring the inputs of the auxiliary ΣΔ ADC with respect to known reference voltages or signals, faults provide an easily detectable pattern observable based on the output of the auxiliary ΣΔ ADC.

Sigma-delta ADCs can be used, for example, in Resolver-to-Digital Converter (RDC) and other automotive applications, such as powertrain applications. To improve reliability in those or other applications, run-time diagnostics can be performed to monitor the system including an ADC for opens, shorts, and other system faults. As examples, such diagnostics can detect failure of signal lines, excitation circuitry, and resolver sensors. As a first example, faults with an RDC ADC itself can be detected. As a difference in voltage is measured by a ΣΔ ADC, an auxiliary ΣΔ ADC can be used to implement diagnostics, which can include measurements beyond simply the difference in voltage of two differential ADC inputs. As a second example, an auxiliary ADC can be used to monitor each RDC ADC input. Such monitoring can be accomplished using a main RDC ADC plus two auxiliary ADCs for diagnostics or one auxiliary ADC whose input can be switched between inputs of the main RDC ADC to provide the diagnostic capability.

In accordance with at least one embodiment, two ΣΔ ADCs that share components are provided. The ADC block comprising the two ΣΔ ADCs has two inputs and can provide two outputs, with one of the two outputs corresponding to one of the two inputs and the other of the two outputs corresponding to the other of the two inputs. The inputs can be switchably selected to provide the same input signal to both the main ΣΔ ADC and the auxiliary ΣΔ ADC or to provide different input signals to the main ΣΔ ADC and the auxiliary ΣΔ ADC.

In accordance with at least one embodiment, a sigma-delta (ΣΔ) analog-to-digital converter (ADC) comprises a main ΣΔ modulator configured to receive an analog input signal at a main ΣΔ modulator input and to provide a main digital output signal representative of the analog input signal and an auxiliary ΣΔ modulator configured to receive an auxiliary input signal at an auxiliary ΣΔ modulator input and to provide an auxiliary digital output signal, wherein the ΣΔ ADC comprises a shared integrator stage, the shared integrator stage is configurable to be used by the main ΣΔ modulator and the auxiliary ΣΔ modulator, wherein, alternatingly, the shared integrator stage is selectively communicatively coupled to receive the analog input signal when configured to be used by the main ΣΔ modulator and selectively communicatively coupled to receive the auxiliary input signal when configured to be used by the auxiliary ΣΔ modulator. In accordance with at least one embodiment, the ΣΔ ADC comprises a status checking circuit coupled to the auxiliary ΣΔ modulator to receive the auxiliary digital output signal and to provide a status indication that indicates a functional status relating to the main ΣΔ modulator. In accordance with at least one embodiment, the shared integrator stage is selectable to be one of a first integrator stage and a second integrator stage. In accordance with at least one embodiment, the shared integrator stage is selectable to be a single one of a first integrator stage and a second integrator stage or to be both of the first integrator stage and the second integrator stage. In accordance with at least one embodiment, the main ΣΔ modulator comprises a first integrator stage having a first integrator stage input to receive a first integrator stage input signal and a first integrator stage output to provide a first integrator stage output signal and a second integrator stage having a second integrator stage input coupled to the first integrator stage output to receive the first integrator stage output signal as a second integrator stage input signal, the second integrator stage having a second integrator stage output to provide a second integrator stage output signal, wherein the shared integrator stage is selected from a group consisting of the first integrator stage and the second integrator stage. In accordance with at least one embodiment, the second integrator stage is selectively communicatively coupled to operate in the auxiliary ΣΔ modulator and is selectively communicatively coupled to operate in the main ΣΔ modulator. In accordance with at least one embodiment, the first integrator stage is selectively communicatively coupled to operate in the auxiliary ΣΔ modulator and is selectively communicatively coupled to operate in the main ΣΔ modulator. In accordance with at least one embodiment, the first integrator stage and the second integrator stage are selectively communicatively coupled to collectively operate in the auxiliary ΣΔ modulator and selectively communicatively coupled to collectively operate in the main ΣΔ modulator. In accordance with at least one embodiment, the auxiliary input signal is selectable among a first supply voltage, a second supply voltage, a common mode voltage, and the analog input signal. In accordance with at least one embodiment, the status indication indicates correspondence between the main digital output signal and the auxiliary digital output signal. In accordance with at least one embodiment, the status indication indicates an ADC input fault.

In accordance with at least one embodiment, a method comprises configuring two integrator stages for operation in a main sigma-delta (ΣΔ) modulator of a ΣΔ analog-to-digital converter (ADC), operating the main ΣΔ modulator to obtain main measurement data, configuring at least one integrator stage of the two integrator stages for operation in an auxiliary ΣΔ modulator, and operating the auxiliary ΣΔ modulator to obtain auxiliary data. In accordance with at least one embodiment, the operating the auxiliary ΣΔ modulator to obtain the auxiliary data comprises operating the auxiliary ΣΔ modulator to obtain as the auxiliary data a status indication related to functionality of the main ΣΔ modulator, wherein the method further comprises determining whether a fault has been detected, wherein the fault affects the main ΣΔ modulator and providing a response to the fault. In accordance with at least one embodiment, the determining if the fault has been detected further comprises comparing a main digital output signal of the main ΣΔ modulator to an auxiliary digital output signal of the auxiliary ΣΔ modulator. In accordance with at least one embodiment, the configuring the at least one integrator stage of the two integrator stages for operation in the auxiliary ΣΔ modulator comprises configuring both of the two integrator stages for operation in the auxiliary ΣΔ modulator. In accordance with at least one embodiment, the method further comprises switching an auxiliary ΣΔ modulator input of the auxiliary ΣΔ modulator between a first supply voltage, a second supply voltage, and an analog input signal, wherein the analog input signal is provided to a main ΣΔ modulator input of the main ΣΔ modulator.

In accordance with at least one embodiment, an integrated circuit comprises a main sigma-delta (ΣΔ) modulator configured to receive an analog input signal and to provide a main digital output signal representative of the analog input signal, the main ΣΔ modulator comprising a first integrator stage and a second integrator stage and an auxiliary ΣΔ modulator configured to receive an auxiliary input signal and to provide an auxiliary digital output signal representative of the auxiliary input signal, the auxiliary ΣΔ modulator utilizing at least one of the first integrator stage and the second integrator stage to serve as an auxiliary integrator stage. In accordance with at least one embodiment, the auxiliary ΣΔ modulator is configured to utilize the first integrator stage as a first auxiliary integrator stage and to utilize the second integrator stage as a second auxiliary integrator stage, wherein the auxiliary integrator stage comprises the first auxiliary integrator stage and the second auxiliary integrator stage. In accordance with at least one embodiment, the integrated circuit further comprises a switch configured to select the auxiliary input signal from among a first supply voltage, a second supply voltage, a common mode voltage, and the analog input signal. In accordance with at least one embodiment, the integrated circuit further comprises a switch configured to select among the auxiliary ΣΔ modulator utilizing a single one of the first integrator stage and the second integrator stage and both of the first integrator stage and the second integrator stage.

The concepts of the present disclosure have been described above with reference to specific embodiments. However, one of ordinary skill in the art will appreciate that various modifications and changes can be made without departing from the scope of the present disclosure as set forth in the claims below. In particular, the extent of component sharing between the main ΣΔ ADC and the auxiliary ΣΔ ADC, the numbers of integrator stages (e.g., order) of the main ΣΔ ADC and the auxiliary ΣΔ ADC, and other attributes described above may be varied according to different embodiments. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A sigma-delta (ΣΔ) analog-to-digital converter (ADC) comprising:
   a main ΣΔ modulator configured to receive an analog input signal at a main ΣΔ modulator input and to provide a main digital output signal representative of the analog input signal;
   an auxiliary ΣΔ modulator configured to receive an auxiliary input signal at an auxiliary ΣΔ modulator input and to provide an auxiliary digital output signal, wherein the ΣΔ ADC comprises a shared integrator stage, the shared integrator stage is configurable to be used by the main ΣΔ modulator and the auxiliary ΣΔ modulator, wherein, alternatingly, the shared integrator stage is selectively communicatively coupled to receive the analog input signal when configured to be used by the main ΣΔ modulator and selectively communicatively coupled to receive the auxiliary input signal when configured to be used by the auxiliary ΣΔ modulator; and
   a status checking circuit coupled to the auxiliary ΣΔ modulator to receive the auxiliary digital output signal and to provide a status indication that indicates a functional status relating to the main ΣΔ modulator.

2. The ΣΔ ADC of claim 1 wherein the shared integrator stage is selectable to be one of a first integrator stage and a second integrator stage.

3. The ΣΔ ADC of claim 1 wherein the shared integrator stage is selectable to be a single one of a first integrator stage and a second integrator stage or to be both of the first integrator stage and the second integrator stage.

4. A sigma-delta (ΣΔ) analog-to-digital converter (ADC) comprising:
   a main ΣΔ modulator configured to receive an analog input signal at a main ΣΔ modulator input and to provide a main digital output signal representative of the analog input signal, wherein the main ΣΔ modulator comprises a first integrator stage having a first integrator stage input to receive a first integrator stage input signal and a first integrator stage output to provide a first integrator stage output signal, and a second integrator stage having a second integrator stage input coupled to the first integrator stage output to receive the first integrator stage output signal as a second integrator stage input signal, the second integrator stage having a second integrator stage output to provide a second integrator stage output signal; and an auxiliary ΣΔ modulator configured to receive an auxiliary input signal at an auxiliary ΣΔ modulator input and to provide an auxiliary digital output signal, wherein the ΣΔ ADC comprises a shared integrator stage, the shared integrator stage is selected from a group consisting of the first integrator stage and the second integrator stage, the shared integrator stage is configurable to be used by the main ΣΔ modulator and the auxiliary ΣΔ modulator, and alternatingly, the shared integrator stage is selectively communicatively coupled to receive the analog input signal when configured to be used by the main ΣΔ modulator and selectively communicatively coupled to receive the auxiliary input signal when configured to be used by the auxiliary ΣΔ modulator.

5. The ΣΔ ADC of claim 4 wherein the second integrator stage is selectively communicatively coupled to operate in the auxiliary ΣΔ modulator and is selectively communicatively coupled to operate in the main ΣΔ modulator.

6. The ΣΔ ADC of claim 4 wherein the first integrator stage is selectively communicatively coupled to operate in the auxiliary ΣΔ modulator and is selectively communicatively coupled to operate in the main ΣΔ modulator.

7. The ΣΔ ADC of claim 4 wherein the first integrator stage and the second integrator stage are selectively communicatively coupled to collectively operate in the auxiliary ΣΔ modulator and selectively communicatively coupled to collectively operate in the main ΣΔ modulator.

8. A sigma-delta (ΣΔ) analog-to-digital converter (ADC) comprising:

a main ΣΔ modulator configured to receive an analog input signal at a main ΣΔ modulator input and to provide a main digital output signal representative of the analog input signal;

an auxiliary ΣΔ modulator configured to receive an auxiliary input signal at an auxiliary ΣΔ modulator input and to provide an auxiliary digital output signal, wherein the ΣΔ ADC comprises a shared integrator stage, the shared integrator stage is configurable to be used by the main ΣΔ modulator and the auxiliary ΣΔ modulator, alternatingly, the shared integrator stage is selectively communicatively coupled to receive the analog input signal when configured to be used by the main ΣΔ modulator and selectively communicatively coupled to receive the auxiliary input signal when configured to be used by the auxiliary ΣΔ modulator, and the auxiliary input signal is selectable among a first supply voltage, a second supply voltage, a common mode voltage, and the analog input signal.

9. The ΣΔ ADC of claim 1 wherein the status indication indicates correspondence between the main digital output signal and the auxiliary digital output signal.

10. The ΣΔ ADC of claim 1 wherein the status indication indicates an ADC input fault.

11. A method comprising:

configuring two integrator stages for operation in a main sigma-delta (ΣΔ) modulator of a ΣΔ analog-to-digital converter (ADC);

operating the main ΣΔ modulator to obtain main measurement data;

configuring at least one integrator stage of the two integrator stages for operation in an auxiliary ΣΔ modulator; and operating the auxiliary ΣΔ modulator to obtain auxiliary data.

12. The method of claim 11 wherein the operating the auxiliary ΣΔ modulator to obtain the auxiliary data comprises:

operating the auxiliary ΣΔ modulator to obtain as the auxiliary data a status indication related to functionality of the main ΣΔ modulator, wherein the method further comprises:

determining whether a fault has been detected, wherein the fault affects the main ΣΔ modulator; and providing a response to the fault.

13. The method of claim 12 wherein the determining if the fault has been detected further comprises:

comparing a main digital output signal of the main ΣΔ modulator to an auxiliary digital output signal of the auxiliary ΣΔ modulator.

14. The method of claim 11 wherein the configuring the at least one integrator stage of the two integrator stages for operation in the auxiliary ΣΔ modulator comprises:

configuring both of the two integrator stages for operation in the auxiliary ΣΔ modulator.

15. The method of claim 11 further comprising:

switching an auxiliary ΣΔ modulator input of the auxiliary ΣΔ modulator between a first supply voltage, a second supply voltage, and an analog input signal, wherein the analog input signal is provided to a main ΣΔ modulator input of the main ΣΔ modulator.

16. An integrated circuit comprising:

a main sigma-delta (ΣΔ) modulator configured to receive an analog input signal and to provide a main digital output signal representative of the analog input signal, the main ΣΔ modulator comprising a first integrator stage and a second integrator stage; and an auxiliary ΣΔ modulator configured to receive an auxiliary input signal and to provide an auxiliary digital output signal representative of the auxiliary input signal, the auxiliary ΣΔ modulator utilizing at least one of the first integrator stage and the second integrator stage to serve as an auxiliary integrator stage.

17. The integrated circuit of claim 16 wherein the auxiliary ΣΔ modulator is configured to utilize the first integrator stage as a first auxiliary integrator stage and to utilize the second integrator stage as a second auxiliary integrator stage, wherein the auxiliary integrator stage comprises the first auxiliary integrator stage and the second auxiliary integrator stage.

18. The integrated circuit of claim 16 further comprising:

a switch configured to select the auxiliary input signal from among a first supply voltage, a second supply voltage, a common mode voltage, and the analog input signal.

19. The integrated circuit of claim 16 further comprising:

a switch configured to select among the auxiliary ΣΔ modulator utilizing a single one of the first integrator stage and the second integrator stage and both of the first integrator stage and the second integrator stage.

* * * * *